United States Patent
Li (10) Patent No.: US 9,440,552 B2
(45) Date of Patent: Sep. 13, 2016

(54) ESTIMATION AND COMPENSATION OF BATTERY MEASUREMENT

(71) Applicant: Ford Global Technologies, LLC, Dearborn, MI (US)

(72) Inventor: Yonghua Li, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 132 days.

(21) Appl. No.: 14/299,437

(22) Filed: Jun. 9, 2014

(65) Prior Publication Data
US 2015/0352972 A1 Dec. 10, 2015

(51) Int. Cl.
| | |
|---|---|
| *B60L 9/00* | (2006.01) |
| *B60L 11/00* | (2006.01) |
| *G05D 1/00* | (2006.01) |
| *G05D 3/00* | (2006.01) |
| *G06F 7/00* | (2006.01) |
| *G06F 17/00* | (2006.01) |
| *B60L 11/18* | (2006.01) |
| *G01R 31/36* | (2006.01) |
| *H01M 10/48* | (2006.01) |

(52) U.S. Cl.
CPC ........ *B60L 11/1861* (2013.01); *G01R 31/3624* (2013.01); *G01R 31/3648* (2013.01); *G01R 31/3651* (2013.01); *H01M 10/482* (2013.01); *H01M 10/486* (2013.01); *G01R 31/3662* (2013.01); *H01M 2220/20* (2013.01)

(58) Field of Classification Search
CPC .......... B60L 11/1861; G01R 31/3648; G01R 31/3624; H01M 10/486
USPC .................................................. 701/22
See application file for complete search history.

(56) References Cited

U.S. PATENT DOCUMENTS

| | | | |
|---|---|---|---|
| 7,612,532 B2 | 11/2009 | Verbrugge | |
| 2010/0153038 A1* | 6/2010 | Tomura | G01R 31/3624 702/63 |
| 2011/0309838 A1 | 12/2011 | Lin et al. | |
| 2012/0101674 A1 | 4/2012 | Wang et al. | |

OTHER PUBLICATIONS

Lin et al., IEEE transactions on Control Systems Technology, Sep. 2013, vol. 21, Issue 5 (11 pages), "Online parameterization of Lumped Thermal Dynamics in Cylindrical Lithium Ion Batteries for Core Temperature Estimation and Healthy Monitoring."*

(Continued)

*Primary Examiner* — Maceeh Anwari
(74) *Attorney, Agent, or Firm* — David B. Kelley; Brooks Kushman P.C.

(57) ABSTRACT

Hybrid or electric vehicles include a traction battery to store and provide motive energy. For effective operation of the traction battery, operating parameters, such as state of charge and battery power limits, may need to be known. The operating parameters can be based on a persistent excitation parameter of the traction battery and a measurement bias of the traction battery that depends on a temporal difference and a temperature difference between parameter measurements of the traction battery. A controller can execute instructions to implement a state estimator configured to output battery state based on a persistent excitation parameter of the traction battery and a measurement bias of the traction battery that depends on at least one of a temporal difference and a temperature difference between parameter measurements of the traction battery, and operate the traction battery according to output of the state estimator.

20 Claims, 6 Drawing Sheets

(56) References Cited

OTHER PUBLICATIONS

Turk, J., Elec Eng & Comp Sci, vol. 20, No. 5, 2012, pp. 819-833, "Stability of the adaptive fading extended Kalman filter with matrix forgetting factor."

Lin, et al., IEEE Transactions on Control Systems Technology, Sep. 2013, vol. 21, Issue 5, (11 pages), "Online Parameterization of Lumped Thermal Dynamics in Cylindrical Lithium Ion Batteries for Core Temperature Estimation and Health Monitoring."

* cited by examiner

ESTIMATION AND COMPENSATION OF BATTERY MEASUREMENT

TECHNICAL FIELD

This application generally relates to calculating battery state of charge and power capability.

BACKGROUND

Hybrid-electric and pure electric vehicles rely on a traction battery to provide power for propulsion. To ensure optimal operation of the vehicle, various properties of the traction battery may be monitored. One useful property is the battery power capability which indicates how much power the battery may supply or absorb at a given time. Another useful property is the battery state of charge which indicates the amount of charge stored in the battery. The battery properties may be important for controlling operation of the battery during charging/discharging, maintaining the battery within operating limits, and balancing cells of the battery.

SUMMARY

A vehicle includes a traction battery including a plurality of cells and at least one controller. The controller is programmed to implement a state estimator configured to estimate battery state based on a persistent excitation parameter of the traction battery and a measurement bias of the traction battery that depends on a temporal difference and a temperature difference between parameter measurements of the traction battery, and operate the traction battery according to output of the state estimator.

In an example, the state estimator applies recursive estimation and a forgetting factor to produce the output. The forgetting factor can be based on a level of persistent excitation of the traction battery.

In an example, the traction battery can be subject to persistent excitation during measurement.

In an example, the forgetting factor can be based on at least one of battery temperature, rate of change of battery temperature or both.

In an example, the forgetting factor uses a distributed extended Kalman filter.

In an example, the state estimator uses an Arrhenius model to determine battery parameters.

In an example, the traction battery includes a plurality of cells. The controller outputs, for each cell, a cell output as part of the battery state.

Various methods as described herein can be used in the vehicle or in the controller. A method of controlling a vehicle can include storing charge in a plurality of cells in a traction battery and outputting from at least one controller a battery state estimation using a persistent excitation parameter of the traction battery and a measurement bias of the traction battery that depends on a temporal difference and a temperature difference between parameter measurements of the traction battery. The traction battery can be operated according to the state of charge defined by output of the state estimator.

In an example, operating includes controlling the traction battery according to battery power limits defined by output of the state estimator.

In an example, outputting includes applying recursive estimation and a forgetting factor to produce the output.

In an example, the forgetting factor is based on a level of persistent excitation of the traction battery.

In an example, the traction battery is subject to persistent excitation.

In an example, the forgetting factor is based on at least one of battery temperature, rate of change of battery temperature or both.

In an example, the forgetting factor uses a distributed extended Kalman filter.

In an example, outputting includes using an Arrhenius model to determine battery state.

In an example, operating the traction battery includes operating the plurality of cells using and output for each cell.

DETAILED DESCRIPTION

Embodiments of the present disclosure are described herein. It is to be understood that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
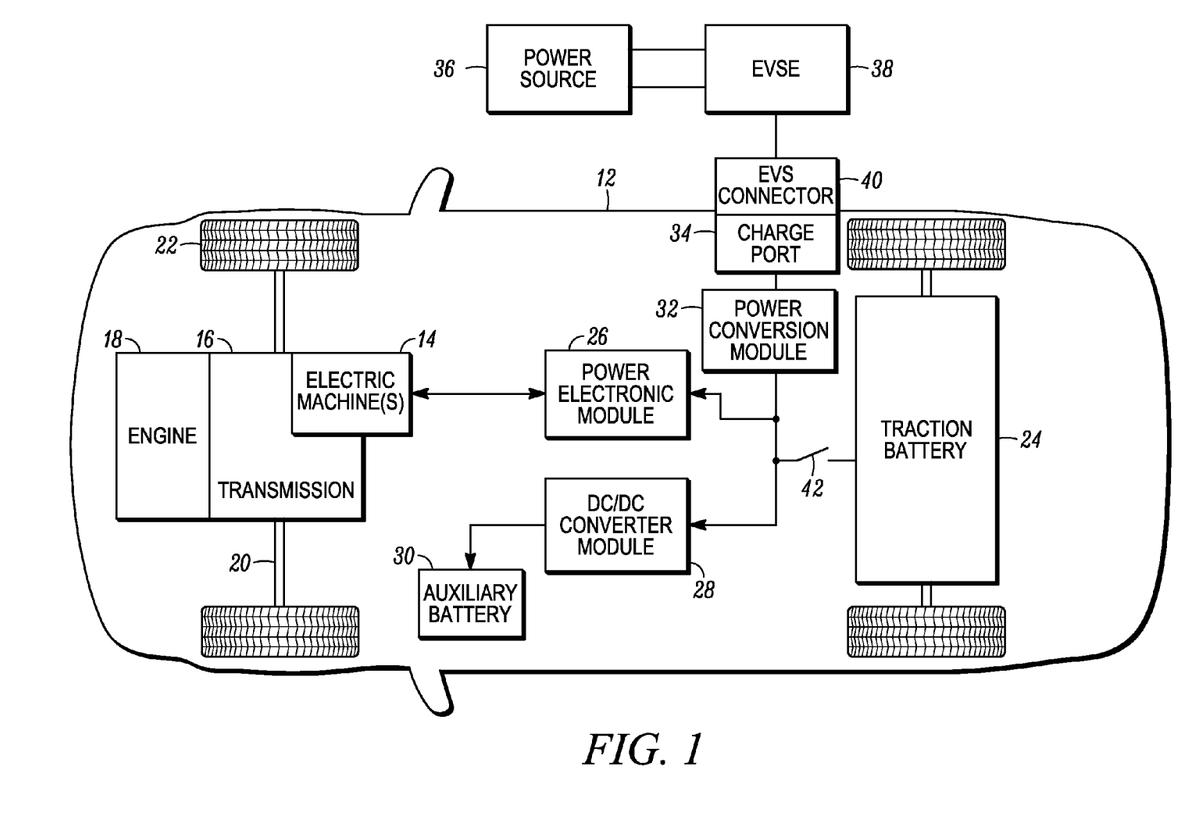
FIG. 1 is a diagram of a plug-in hybrid-electric vehicle illustrating typical drivetrain and energy storage components.

FIG. 1 depicts a typical plug-in hybrid-electric vehicle (HEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also provide reduced pollutant emissions since the hybrid-electric vehicle 12 may be operated in electric mode under certain conditions.

A traction battery or battery pack 24 stores energy that can be used by the electric machines 14. A vehicle battery pack 24 typically provides a high voltage DC output. The traction battery 24 may be electrically connected to one or more power electronics modules 26 through one or more contactors 42. The one or more contactors 42 isolate the traction battery 24 from other components when opened and connects the traction battery 24 to other components when closed. The power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may require a three-phase AC current to function. The power electronics module 26 may convert the DC voltage to a three-phase AC current as required by the electric machines 14. In a regenerative mode, the power electronics module 26 may convert the three-phase AC current from the electric machines 14 acting as generators to the DC voltage required by the traction battery 24. The description herein is equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads, such as compressors and electric heaters, may be connected directly to the high-voltage without the use of a DC/DC converter module 28. In a typical vehicle, the low-voltage systems are electrically connected to an auxiliary battery 30 (e.g., 12V battery).

The vehicle 12 may be an electric vehicle or a plug-in hybrid vehicle in which the traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34.

The various components discussed may have one or more associated controllers to control and monitor the operation of the components. The controllers may communicate via a serial bus (e.g., Controller Area Network (CAN)) or via discrete conductors. The controllers include circuitry or processors that when executing instructions and methods described herein for a specific processing machine adapted to the present disclosure.

Figure 2:
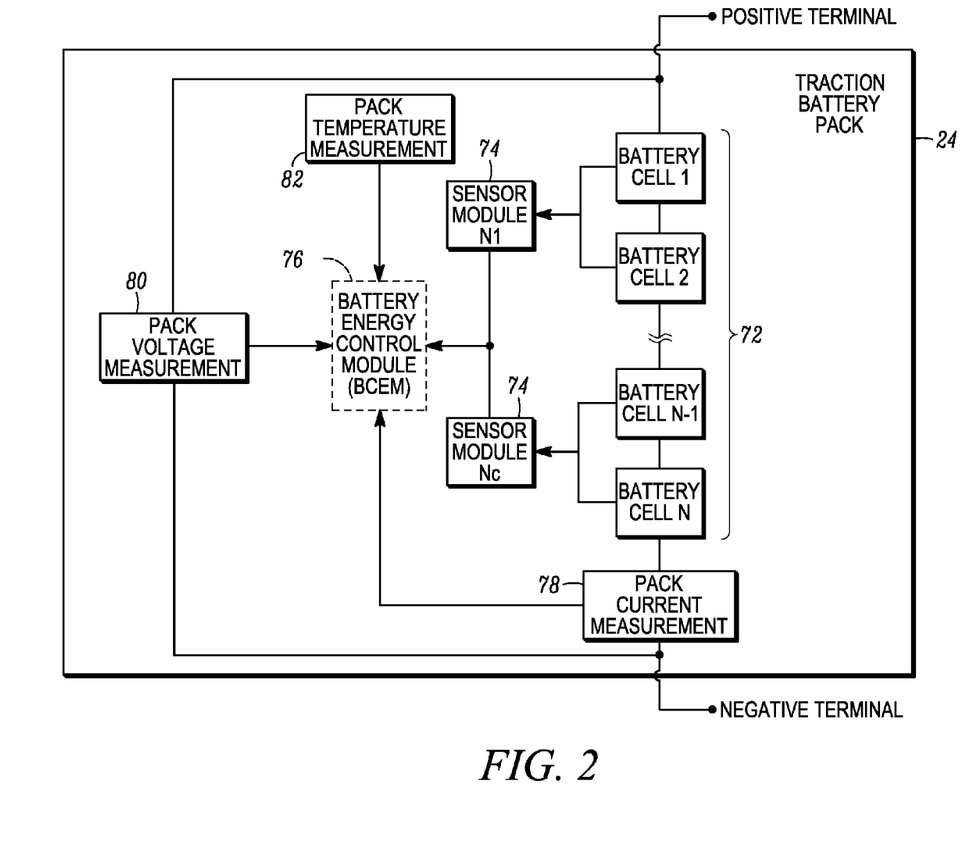
FIG. 2 is a diagram of a possible battery pack arrangement comprised of multiple cells, and monitored and controlled by a Battery Control Module.

A traction battery 24 may be constructed from a variety of chemical formulations. Typical battery pack chemistries are lead acid, nickel-metal hydride (NIMH) or Lithium-Ion. FIG. 2 shows a typical traction battery pack 24 in a simple series configuration of N battery cells 72. Other battery packs 24, however, may be composed of any number of individual battery cells connected in series or parallel or some combination thereof. A typical system may have a one or more controllers, such as a Battery Energy Control Module (BECM) 76 that monitors and controls the performance of the traction battery 24. The BECM 76 may monitor several battery pack level characteristics such as pack current 78, pack voltage 80 and pack temperature 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. A system may use a sensor module 74 to measure the battery cell 72 characteristics. Depending on the capabilities, the sensor module 74 may measure the characteristics of one or multiple of the battery cells 72. The battery pack 24 may utilize up to $N_c$ sensor modules 74 to measure the characteristics of all the battery cells 72. Each sensor module 74 may transfer the measurements to the BECM 76 for further processing and coordination. The sensor module 74 may transfer signals in analog or digital form to the BECM 76. In some embodiments, the sensor module 74 functionality may be incorporated internally to the BECM 76. That is, the sensor module 74 hardware may be integrated as part of the circuitry in the BECM 76 and the BECM 76 may handle the processing of raw signals.

It may be useful to calculate various characteristics of the battery pack. Quantities such a battery power capability and battery state of charge may be useful for controlling the operation of the battery pack as well as any electrical loads receiving power from the battery pack. Battery power capability is a measure of the maximum amount of power the battery can provide or the maximum amount of power that the battery can receive for the next specified time period, for example, 1 second or less than one second. Knowing the battery power capability allows electrical loads to be managed such that the power requested is within limits that the battery can handle.

Battery pack state of charge (SOC) gives an indication of how much charge remains in the battery pack. The battery pack SOC may be output to inform the driver of how much charge remains in the battery pack, similar to a fuel gauge. The battery pack SOC may also be used to control the operation of an electric or hybrid-electric vehicle. Calculation of battery pack or cell SOC can be accomplished by a variety of methods. One possible method of calculating battery SOC is to perform an integration of the battery pack current over time. One possible disadvantage to this method is that the current measurement may be noisy. Possible inaccuracy in the state of charge may occur due to the integration of this noisy signal over time. Calculation of battery pack or cell SOC can also be accomplished by using an observer, whereas a battery model is used for construction of the observer, with measurements of battery current, terminal voltage, and temperature. Battery model parameters may be identified through recursive estimation based on such measurements.

The accuracy of voltage and current sensor measurement depend on many factors. Noise may impact the signal that is measured. For example, accuracy of a hall-effect type current sensor may depend on shielding the sensor and conductors from environmental magnetic fields. Biases in the sensor measurements may also be present. Prior art systems may utilize current measurements taken prior to contactor closing to calculate a current measurement bias. Before the contactor closes, there should be no current flowing.

A battery management system may estimate various battery parameters based on the sensor measurements. Current and voltage sensor biases and inaccuracies may be time-varying in nature. Therefore, pre-contactor close compensation may not be accurate enough over the entire operating time of the sensors. The short sample time before the contactor is closed only allows limited sampling of the current sensor. The pre-contactor close samples may not be accurate due to the rise time of the current sensor from BECM start-up. Another significant issue may be the lack of exact synchronization in voltage and current measurements. Battery parameter identification depends on well-defined inputs (current) and outputs (terminal voltage). A loss of synchronization between the signals may result in measured data that does not accurately represent the real battery behavior which may lead to erroneous parameter estimation.

Figure 3:
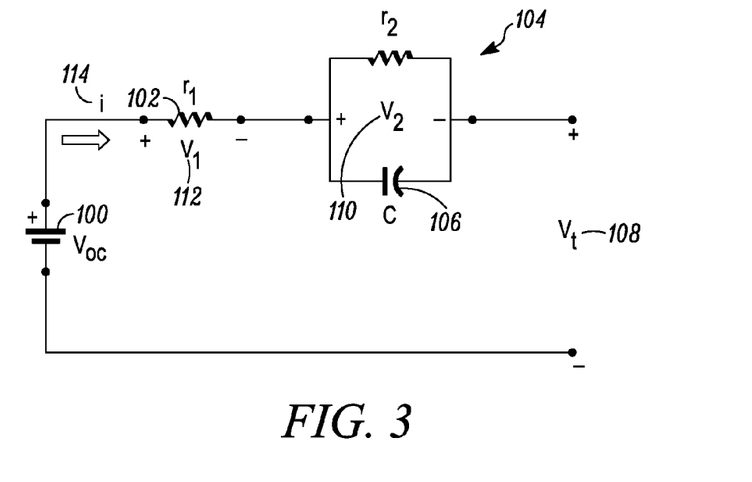
FIG. 3 is a diagram of an example battery cell equivalent circuit.

FIG. 3 shows one possible battery cell equivalent circuit model (ECM). A battery cell may be modeled as a voltage source ($V_{oc}$) 100 having associated resistances (102 and 104) and capacitance 106. Because of the battery cell impedance, the terminal voltage, $V_t$ 108, is typically not the same as the open-circuit voltage, $V_{oc}$ 100. The open-circuit voltage, $V_{oc}$ 100, is not readily measurable as only the terminal voltage 108 of the battery cell is accessible for measurement. Because the $V_{oc}$ 100 is not readily measurable, a model-based method may be used to estimate the value. A model may require that the values of resistances and capacitance be known or estimated. The battery cell model may depend on the battery chemistry. The precise model chosen for the battery cell is for illustrative purposes and other methods of representing the battery may be used with the systems and methods described herein.

The ideal circuit model may be represented by state space equations in the continuous time domain as follows:

$$\dot{V}_{oc} = -\frac{df(soc)}{dsoc} * \frac{1}{Q} * i \quad (1)$$

$$\dot{V}_2 = -\frac{1}{r_2 C} V_2 + \frac{1}{C} * i \quad (2)$$

$$V_t = V_{oc} - V_2 - r_1 * i \quad (3)$$

In discrete time, the circuit model may be expressed as follows:

$$V_{oc}(k+1) = V_{oc}(k) - T_s * \frac{df(soc)}{dsoc} * \frac{1}{Q} * i(k) \quad (4)$$

$$V_2(k+1) = \left(1 - T_s * \frac{1}{r_2 C}\right) * V_s(k) + T_s * \frac{1}{C} * i(k) \quad (5)$$

$$V_t(k) = V_{oc}(k) - V_2(k) - r_1 * i(k) \quad (6)$$

Two uncertainty factors may be associated with the input current i(k). First, the current may be leading (or lagging) the voltage measurement by $k_a$ time steps. Second, the current may be biased toward a true current value by $I_b$ amperes. Incorporating these uncertainty factors into equations (4)-(6) gives the following expressions:

$$V_{oc}(k+1) = V_{oc}(k) - T_s * \frac{df(soc)}{dsoc} * \frac{1}{Q} * (i(k-k_a) + I_b) \quad (7)$$

$$V_2(k+1) = \left(1 - T_s * \frac{1}{r_2 C}\right) * V_2(k) + T_s * \frac{1}{C} * (i(k-k_a) + I_b) \quad (8)$$

$$V_t(k) = V_{oc}(k) - V_2 - r_1 * (i(k-k_a) + I_b) \quad (9)$$

The term $(i(k-k_a)+I_b)$ may represent the true or actual current. It may be desirable to express this term as a function of the measured current, i(k). The actual current may be expressed as $(i(k)+i_b(k))$. The term $i_b(k)$ is equal to $((i(k-k_a)+I_b-i(k))$ and represents the total asynchronization and measurement bias between the actual current and the measured current. The asynchronization bias may represent the temporal difference between the traction battery current measurement and the cell terminal voltage measurement. Equations (7)-(9) may now be expressed as:

$$V_{oc}(k+1) = V_{oc}(k) - T_s * \frac{df(soc)}{dsoc} * \frac{1}{Q} * (i(k) + i_b(k)) \quad (10)$$

$$V_2(k+1) = \left(1 - T_s * \frac{1}{r_2 C}\right) * V_2(k) + T_s * \frac{1}{C} * (i(k) + i_b(k)) \quad (11)$$

$$V_t(k) = V_{oc}(k) - V_2 - r_1 * (i(k) + i_b(k)) \quad (12)$$

Equations (10)-(12) may form the basis of "projection" in an adaptive battery controls scheme. $V_{oc}$ represents the open circuit voltage (OCV). $V_t$ represents the cell terminal voltage. The term $i_b(k)$ is the delta current between the measured and the actual current.

The SOC and power capability of the battery can be estimated in the vehicle itself, e.g., in real-time, with the vehicle in use by a consumer using a model based approach. The battery model can be stored in memory in electronics and circuitry in the vehicle. The battery can be modeled as a simplified Randles circuit (see FIG. 3) with the model parameters, e.g., ohmic resistance, charge transfer resistance, double layer capacitance being related to battery temperature and, for most batteries, SOC. However, the dominant factor can be battery temperature. For example, charge transfer resistance can be modeled using Arrhenius equation:

$$r = r_0 * \exp\left(E_a * \left(\frac{1}{kT} - \frac{1}{kT_0}\right)\right) \quad (13)$$

with T being absolute temperature in kelvin, $r_0$ being the pre-exponential factor (or simply the prefactor), $T_0$ being temperature (in kelvin) associated with $r_0$, $E_a$ being the activation energy, and k being the Universal constant. Other parameters, for example, ohmic resistance, can be modeled as a function of temperature for begin-of-life battery using lab. test results.

Since battery parameters change with temperature (and SOC), how these parameters change in a real world usage, for example, electrified vehicle driving, would be determined mostly by how battery temperature changes, although on a much slower rate, these parameters change as battery dynamics change due to usage and time-based aging mechanism. Hence, in order to track the changes of such parameters, the method of using an Extended Kalman Filter, or other recursive computation method where parameters are treated as constant, may not work with as much precision as the present method. Accordingly, the present method uses a forgetting factor method, which is widely adopted in recursive estimation of dynamic system parameters. In an example, the forgetting factor is adjusted based on temperature of the battery. In a further example, the forgetting factor is not set in advance and will change based on the battery temperature data. In an example, the temperature and temperature rate of change is taken into account in the Arrhenius equation.

The present method considers persistent excitation in operation of a controller to arrive at a state estimation of the battery. The persistent excitation can be used to determine a distributed forgetting factor. If the persistent excitation level is higher, then the forgetting factor is smaller, which discounts past learned parameter values faster. Based on that, further adjustment can be made to the state estimation. Some parameters follow certain relationship of temperature and SOC. These can be determined at the begin-of-life battery test in the lab. For example, charge transfer resistance follows that of Arrhenius relationship with battery temperature. Hence, the lower the battery temperature or the faster the temperature change, the smaller the forgetting factor needs to be. On the other hand, if temperature is high and temperature change rate is low, then the forgetting factor can be close to uniform.

Figure 4:
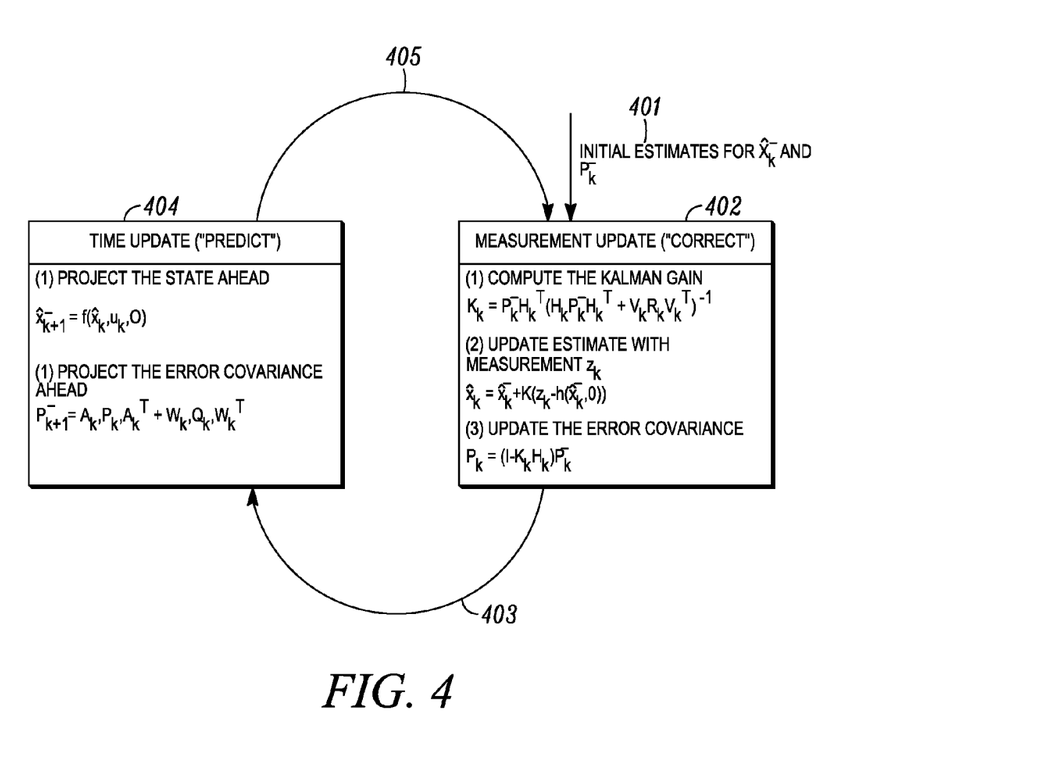
FIG. 4 is a diagram illustrating a Distributed Forgetting Extended Kalman Filter.

From test data, it is clear that asynchronization, when lumped with sensor bias, is a rather time-varying term. Hence, a treatment as a constant term may not reflect the real quantity of such a term, although in reality no one can measure it. The present disclosure uses a distributed forgetting factor (extended) Kalman filter ("DFEKF"). DFEKF uses forgetting factors for various states and discount the learned values as time progresses. A schematic diagram of a DFEFK is shown in FIG. 4.

A state estimator may be implemented in a controller, which includes circuitry, hardware, executes instructions to estimate voltage and impedance parameters of the equivalent circuit model. Different sets of states and parameters for the battery model may be defined for use in an Extended Kalman Filter (EKF). The state vector may be defined as:

$$x = \begin{bmatrix} x_1 \\ x_2 \\ x_3 \\ x_4 \\ x_5 \\ x_6 \end{bmatrix} = \begin{bmatrix} V_{oc} \\ V_2 \\ r_2 C \\ r_1 + r_2 \\ r_1 r_2 c \\ \Delta I * (r_1 + r_2) \end{bmatrix} \quad (14)$$

$V_{oc}$ is the open circuit voltage of the battery. $V_2$ is the voltage across the RC network; $r_1$ is the ohmic resistance; $r_2$ is the charge transfer resistance; c is the double layer capacitance; and $\Delta I$ is the equivalent current sensor bias, which incorporates both the current and voltage sensor inaccuracies, and the asynchronization related measurement error.

It may be assumed that the impedance parameters ($r_1$, $r_2$, and c) and the current sensor bias vary slowly over time and may vary over temperatures of the battery. As such, their respective derivatives and noise inputs may be assumed to be zero in some use cases.

A discrete time representation of the battery parameter learning for the single cell model of FIG. 3 is $$[V_{oc}(t) - V(t)] = \left[ \frac{d(V(t) - V_{oc}(t))}{dt} I(t) \frac{dI(t)}{dt} 1 \right] * \begin{bmatrix} r_2 c_2 \\ r_1 + r_2 \\ r_1 r_2 c_2 \\ \Delta I * (r_1 + r_2) \end{bmatrix} \quad (15)$$

In order to estimate the parameters in equation 14, the associated "persistent excitation" matrix for the given estimation time window has to satisfy the following conditions:

$$\begin{aligned} & a_0 I \geq \\ & \frac{1}{T_{cal}} * \int_{t_0}^{t_0 + T_{cal}} \left[ \frac{d(V(\tau) - Voc(\tau))}{d\tau} I(\tau) \frac{dI(\tau)}{d\tau} 1 \right]^T * \\ & \geq a_1 I \end{aligned} \quad (16)$$

$$\left[ \frac{d(V(\tau) - Voc(\tau))}{d\tau} I(\tau) \frac{dI(\tau)}{d\tau} 1 \right] d\tau$$

Accordingly, if the regressor based PE matrix satisfies a positive definiteness condition, the parameters, including the equivalent circuit parameters, can be estimated unbiased.

For various states and parameters need to be updated using distributed forgetting factors. This requires going back to the persistent excitation state of the battery and accounting for at least one of battery temperature, battery temperature change rate or both. Battery internal open circuit voltage, $V_{oc}$, is a quantity related to charge placed in or removed from the battery. As such, it changes rather fast and based on the property of the EKF, there is no need to use forgetting factor to determine its value. Hence, the corresponding value can be set to 1 (default). Similarly, the battery internal RC network voltage, $V_2$, does not need to use forgetting factor. Battery ohmic resistance, $r_1$, changes with temperature (and SOC, for some chemistry used in the certain batteries). As such, a polynomial fitting of battery ohmic resistance vs. battery temperature can be obtained from begin-of-life testing data. Without loss of generality, assume $r_1$ is a $3^{rd}$ order polynomial function of the inverse of temperature (in kelvin), so:

$$r_1 = a_0 + a_1 * T^{-1} + a_2 * T^{-2} + a_3 * T^{-3} \quad (17)$$

Change of $r_1$ with respect to battery temperature can be assessed as:

$$\frac{dr_1}{dt} = \frac{dr_1}{dT} * \frac{dT}{dt} \quad (18)$$

$$\frac{dr_1}{dt} = (-a_1 * T^{-2} - 2 * a_2 * T^{-3} - 3 * a_3 * T^{-4}) * \frac{dT}{dt}$$

$$\frac{dr_1}{dt} = f_{r1}(T, dT/dt)$$

By evaluating the above equation with battery temperature and its change rate, it is possible to determine how fast the battery ohmic resistance is changing with respect to temperature change, and accordingly, forgetting factor is selected based on such change rate.

The forgetting factor can be similarly determined for parameters $r_2$ and $c_2$. For example, $r_2$ normally follows the Arrhenius relationship. However, it can be easily approximated by another polynomial function of temperature T. As such, we generally write their change rates as:

$$\frac{dr_2}{dt} = f_{r2}(T, dT/dt) \quad (19)$$

$$\frac{dc_2}{dt} = f_{c2}(T, dT/dt) \quad (20)$$

With the relationships between individual parameter and that of the temperature and temperature change rate, the equivalent parameters $r_2c_2$, $r_1+r_2$, and $r_1r_2c_2$ can be determined with respect to temperature and temperature change rate. For example, $$\frac{dr_2c_2}{dt} = r_2(T) * \frac{dc_2}{dt} + c_2(T) * \frac{dr_2}{dt} \quad (21)$$

$$\frac{dr_2c_2}{dt} = f_{r2c2}(T, dT/dt)$$

A discount factor for the equivalent current sensor bias, ΔI, can be determined. The forgetting factor can be selected as a pre-calibrated value since the sensor biases and asynchronization do not appear to have any model. As such, the forgetting factor for ΔI can be set to a value close to but not 1.0, e.g., 0.999. In addition to the fixed value for the current sensor bias, the values for $r_1r_2$ can be used as a multiplication of the given calibrated value.

Once the persistent excitation (PE) value for the parameter learning scheme is high, it is believed that the present time parameter estimation is unbiased; hence, a smaller forgetting factor (or, equivalent, faster forgetting) can be used. On the other hand, if persistent excitation value is low, then it is probably a good idea to stick to older values since the new values as learned may not be meaningful. As a rule, a persistent excitation-based distributed forgetting can be designed as $$\lambda = \begin{cases} f(PE) & \text{if } PE > \text{threshold} \\ 1 & \text{otherwise} \end{cases}$$

In addition to the PE value as stated above, it is important to notice that at different temperature, and different temperature rate, battery parameters change at different rates. Hence, to learn these parameters without prior knowledge, different forgetting factors are used.

Battery internal open circuit voltage, $V_{oc}$, and the battery internal RC network voltage, $V_2$, either change very fast or has no known relationship dominated by temperature and its change rate. As such, no further modification is required based on temperature or temperature rate of change.

The parameters $r_1$, $r_2$ and $c_2$, and all have some dependence on temperature or temperature change rate. For purposes of explanation, these parameters are denoted as θ. With dθ/dt calculated from measured battery temperature, and the change rate of an individual parameter with respect to temperature change rate, the distributed forgetting factors can be calculated as:

$$\lambda = \begin{cases} f(PE) * \gamma\left(\frac{d\theta}{dt}\right) & \text{if } PE > \text{threshold} \\ 1 & \text{otherwise} \end{cases}$$

Where γ is a map associated with parameters $r_1$, $r_2$ and $c_2$ and/or their combinations. It will be appreciated that different parameters can use different matrices or maps. It will further be appreciated that such distributed forgetting factors may be implemented as look-up tables (stored in memory, or simply as finite discrete values based on quantification of factors such as PE level, temperature, and temperature change rate.

A distributed forgetting factor matrix can be as follows:

$$\Lambda_k = \begin{bmatrix} 1 & 0 & 0 & 0 & 0 & 0 \\ 0 & 1 & 0 & 0 & 0 & 0 \\ 0 & 0 & \lambda_{r2c2}\left(PE, T, \frac{dT}{dt}\right) & 0 & 0 & 0 \\ 0 & 0 & 0 & \lambda_{r1+r2}\left(PE, T, \frac{dT}{dt}\right) & 0 & 0 \\ 0 & 0 & 0 & 0 & \lambda_{r1r2c2}\left(PE, T, \frac{dT}{dt}\right) & 0 \\ 0 & 0 & 0 & 0 & 0 & \alpha * \lambda_{r1+r2}\left(PE, T, \frac{dT}{dt}\right) \end{bmatrix} \quad (22)$$

The forgetting factors associated with $V_{oc}$, $V_2$ are assigned to be 1. The forgetting factors associated with $r_1$, $r_2$ and $c_2$ or their combinations are calculated in circuitry, e.g., the state estimator or the controller, using the calculation of persistent excitation level (PE), battery temperature, and battery temperature change rate. The forgetting factor associated with equivalent current sensor bias, ΔI, can be set since no formal relationships can be established between such equivalent sensor inaccuracy, and other measurable battery variables.

The update equations are as follows:

$$\hat{x}_{k+1}^- = f(\hat{x}_k^+, u_k) \quad (23)$$

$$P_{k+1}^- = A_k \Lambda_k P_k^+ \Lambda'_k A'_k + \Lambda_k Q_k \Lambda'_k \quad (24)$$

The measurement update equations are as follows:

$$K_k = P_k^- C_k'(C_k P_k^- C_k + R_k)^{-1} \quad (25)$$

$$\hat{x}_k^+ = f(\hat{x}_k^-, u_k) + K_k(y_k - h(\hat{x}_k^-)) \quad (26)$$

$$P_k^+ = (I - K_k C_k) P_k^- \quad (27)$$

The above distributed forgetting factor EKF may be performed for each cell of the battery pack, such that battery parameters can be calculated using taking into account the effect of temperature and temperature change rate and asynchronization between current and voltage sensor measurements is estimated for each cell of the traction battery. The above strategy allows that at least some of the cells may have battery parameters.

The present disclosure improves general control theory area recursive estimation algorithm in that the forgetting factor selection uses persistent excitation level. The present disclosure further improves on the use of distributed forgetting factors for battery model parameters change with battery temperature, and temperature change rate. The present disclosure provides an alternative implementation for estimating equivalent battery sensor bias, which incorporates current and voltage sensor biases, and the asynchronization error between these two signals.

The above formulation should lead to improved estimates of the battery parameters and the open-circuit voltage. Since the measurement biases are taken into account, the actual current value is represented in the model. The resulting voltage and impedance parameters may have improved accuracy since current measurement bias for each cell is accounted for in the state estimation model. The improved estimates may be used to calculate other related battery parameters or characteristics.

One application of the above model and EKF is to estimate the power capability of the battery. The first order differential equation from equations (2) and (3) can be solved using the estimated battery ECM voltage and impedance parameters of equation (13) to yield the following expression for the battery current (I).

$$I = \frac{\left(V_{oc} - V_t - \hat{V}_2(0)e^{-t_d/(\hat{r}_2 \cdot \hat{C})}\right)}{\left[\hat{r}_1 + \hat{r}_2\left(1 - e^{-t_d/(\hat{r}_2 \cdot \hat{C})}\right)\right]} \quad (28)$$

where: $t_d$ is a predetermined time value; $\hat{V}_2(0)$ is the present value of $V_2$, and e is the base of the natural logarithm.

In general, once the value for I from equation (28) is determined, the battery power capability can be found. Where it is desired to determine a charge power capability for the battery, equation (28) can be solved for a minimum value of I, such as shown in equation (29). By convention, current is defined as a positive (+) quantity when flowing away from a battery (discharge), and as a negative (−) quantity when flowing into the battery (charge).

$$I_{min}(t_d, V_{max}) = \frac{V_{oc} - V_{max} - \hat{V}_2(0)e^{-t_d/(\hat{r}_2 \hat{C})}}{\left[\hat{r}_1 + \hat{r}_2\left(1 - e^{-t_d/(\hat{r}_2 \hat{C})}\right)\right]} \leq 0 \quad (29)$$

where: the value of $(t_d)$ is predetermined, and may be for example, between 1 sec. and 10 sec., and $V_{max}$ is a maximum operating voltage for the battery, and may be considered a limiting battery voltage.

This current is then compared with a system charge current limit ($I_{lim\_ch}$). If $I_{min}(t_d, V_{max}) < I_{lim\_ch}$, a second voltage value is calculated according to equation (30), as shown below:

$$\overline{V}_{ch} = V_{oc} - \hat{V}_2(0)e^{-t_d/(\hat{r}_2 \hat{C})} - I_{lim\_ch} * [\hat{r}_1 + \hat{r}_2(1 - e^{-t_d/(\hat{r}_2 \hat{C})})] \quad (30)$$

The time value ($t_d$) can be based on how battery power capabilities are used by vehicle system controller. The voltage ($V_{max}$) may be determined, for example, by a vehicle manufacturer or a battery manufacturer as the maximum voltage that the battery is allowed to reach.

The charge power capability ($P_{cap\_ch}(t_d)$) for a battery as a function of time ($t_d$) can be written in accordance with equation (31).

$$P_{cap\_ch}(t_d) = \begin{cases} |I_{min}| * V_{max} & \text{if } I_{min} \geq I_{lim\_ch} \\ |I_{lim\_ch}| * \overline{V}_{ch} & \text{Otherwise} \end{cases} \quad (31)$$

In addition to determining a charge power capability for a battery, a method for determining a discharge power capability for the battery may also be provided. For determining the discharge power capability, a maximum value of the battery current I may be used in conjunction with a minimum value of the battery voltage. $I_{max}$ can be solved as shown in equation (32).

$$I_{max}(t_d, V_{min}) = \frac{\left(V_{oc} - V_{min} - \hat{V}_2(0)e^{-t_d/(\hat{r}_2 \hat{C})}\right)}{\left[\hat{r}_1 + \hat{r}_2\left(1 - e^{-t_d/(\hat{r}_2 \hat{C})}\right)\right]} \quad (32)$$

where: $V_{min}$ is a minimum operating voltage of the battery pack.

This current is then compared with a system discharge current limit $T_{lim\_dch}$. If $I_{max}(t_d, V_{min}) > I_{lim\_dch}$, a second voltage value is calculated according to equation (33) as shown below:

$$\overline{V}_{dch} = V_{oc} - \hat{V}_2(0)e^{-t_d/(\hat{r}_2 \hat{C})} - I_{lim\_dch} * [\hat{r}_1 + \hat{r}_2(1 - e^{-t_d/(\hat{r}_2 \hat{C})})] \quad (33)$$

The discharge power capability ($P_{cap\_dch}(t_d)$) for the battery as a function of the time ($t_d$) can be determined as shown in equation (34).

$$P_{cap\_dch}(t_d) = \begin{cases} |I_{max}| * V_{min} & \text{if } I_{max} \geq I_{lim\_dch} \\ |I_{lim\_dch}| * \overline{V}_{dch} & \text{Otherwise} \end{cases} \quad (34)$$

Equations (28)-(34) calculate power capability based on the battery ECM impedance parameters (e.g., $r_1$, $r_2$ and C) that are estimated by the EKF (equation (13)). Note that other calculation methods may be possible. The above calculation scheme is merely representative of using a battery impedance parameter estimation model to calculate battery power capability. Other calculation methods for battery power capability are possible.

The battery may then be operated based on the calculated battery power capability. That is, battery current and voltage may be maintained so as not to exceed the battery power capability. Electrical loads receiving power from or providing power to the battery may be operated such that the total power of all loads falls within the calculated battery power capability. For example, electric machines may have power limits reduced so that the battery power capability is not exceeded.

The above described equivalent circuit model may be applied to estimating the battery state of charge. One of the estimated voltage parameters may be the open-circuit voltage of the cell. The state of charge may be found by using the OCV/SOC relationship of FIG. 4 which may be expressed as a table or equivalent function within the controller.

The described system may continually calculate the measurement current bias while the traction battery is connected to electrical loads of the vehicle. There is no requirement that the contactor be open to measure and calculate the bias current. In addition, the system may compensate for a bias current that varies slowly over time.

In practice, the asynchronization bias may be a time-varying term. The above scheme treats the bias current as a nearly constant term and may not necessarily be optimal for a time-varying term. To better account for a time-varying bias current, a Distributed Faded EKF (DFEKF) may be used. The DKEKF uses forgetting factors for the various states to discount the learned values as time progresses. The above formulations and system of equations may still apply but the EKF is replaced.

The time update equations can be as follows:

$$\hat{x}_k^- = f(\hat{x}_{k-1}, u_{k-1}) \quad (39)$$

$$P_k^- = A_k \Lambda_k P_{k-1} \Lambda_k^T A_k^T + \Lambda_k Q_{k-1} \Lambda_k^T \quad (40)$$

The measurement update equations (29)-(31) may be replaced by equations (41)-(43) as follows:

$$K_k = P_k^- H_k^T (H_k P_k^- H_k^T + R_k)^{-1} \quad (41)$$

$$\hat{x}_k = \hat{x}_k^- + K_k(z_k - h(\hat{x}_k^-)) \quad (42)$$

$$P_k = (I - K_k H_k) P_k^- \quad (43)$$

A discounting factor the state variable $x_6$ representing the current measurement bias term may be formulated. According to equation (22), if battery temperature is held constant, then the forgetting factor matrix may be designed as:

$$\Lambda_k = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & \alpha \end{bmatrix} \quad (44)$$

where $\alpha$ may be a calibrated value, and may be set to a value less than one, for example. Over time, the bias current estimate may be allowed to adjust to the time-varying value.

FIG. 4 shows a diagram 400 of a distributed forgetting factor extended Kalman filter ("DFEKF") as part of a state estimator. Initial parameter and matrix estimates are fed (401) into the measurement update process 402. The measurement update process computes the Kalman gain, updates estimates with measurement, e.g., $z_k$, and updates the error covariance. The output 403 is fed into a time update computation 404, in which the next state is predicted and the error covariance is predicted. These are then fed back at 405 into the measurement update process 402.

Figure 5:
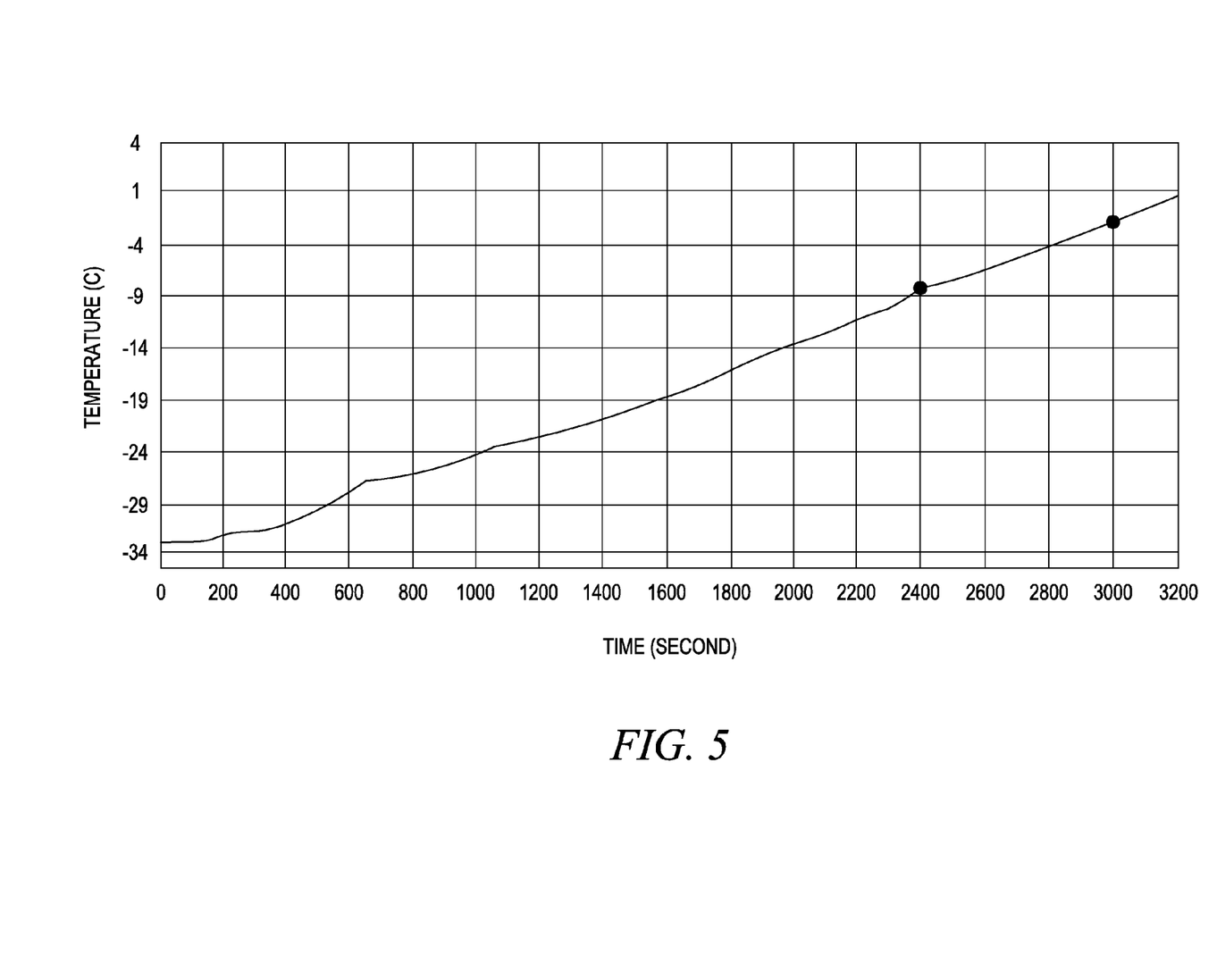
FIG. 5 is a graph illustrating battery temperature change for an example of a traction battery.
Figure 6:
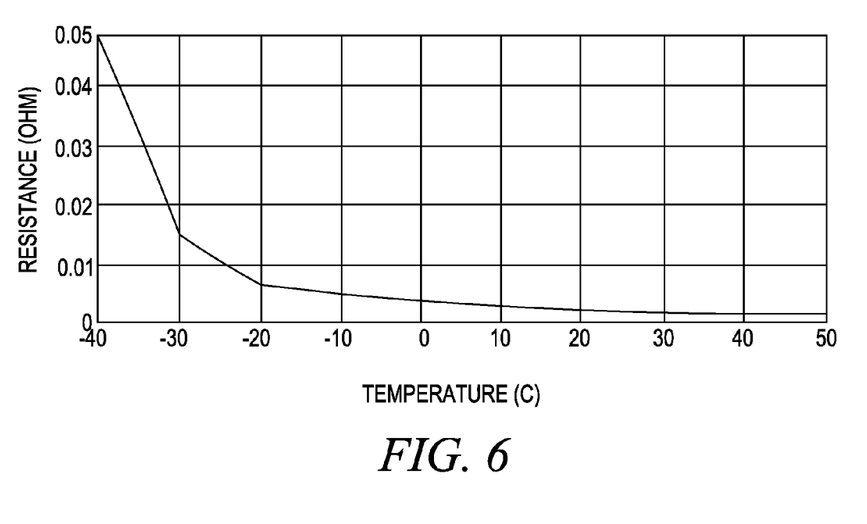
FIG. 6 is a graph illustrating resistance versus temperature for an example of a traction battery.
Figure 7:
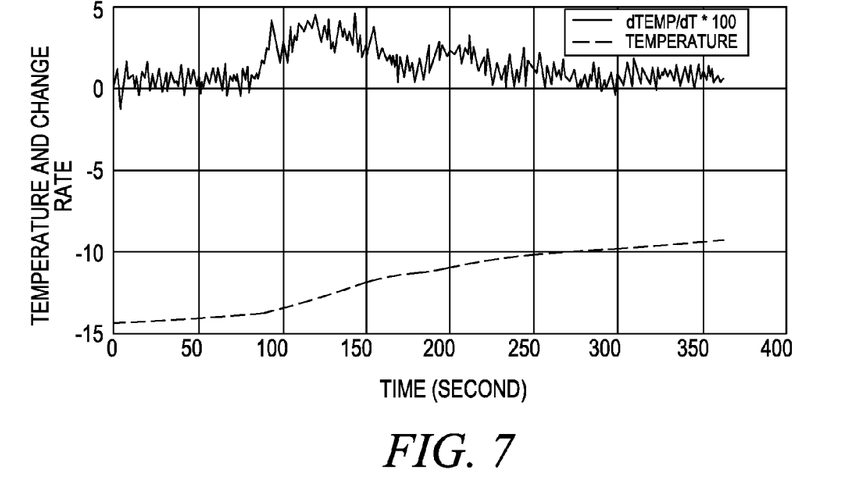
FIG. 7 is a graph illustrating both battery temperature and temperature change rate as a function of time for an example of a traction battery.

For a typical traction battery, e.g., Lithium-Ion battery or cell, there is a relationship various relationships that pertain to the present systems and methods. FIG. 5 shows a traction battery's temperature as a function of time, e.g., a persistent excitation state. As time increases the temperature increases, here generally linearly. FIG. 6 shows internal battery resistance as a function of battery temperature. FIG. 7 shows both temperature and temperature change rate on its graph for an example Lithium-Ion battery.

Figure 8:
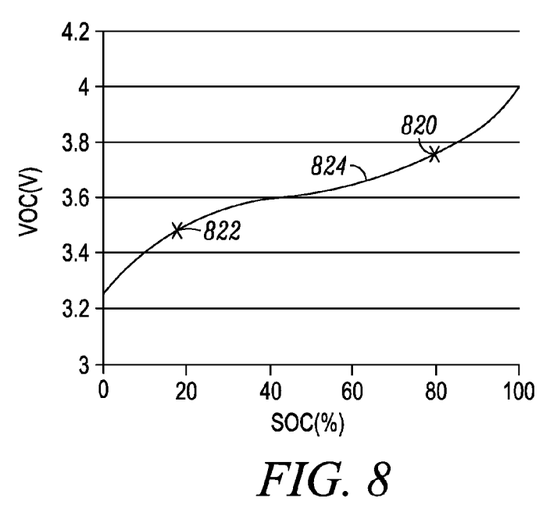
FIG. 8 is a graph illustrating cell voltage versus state of charge for an example traction battery.

FIG. 8 shows a typical curve 824 showing the open-circuit voltage $V_{oc}$ as a function of SOC. The relationship between SOC and $V_{oc}$ may be determined from an analysis of battery properties or from testing the battery cells. The function may be such that SOC may be calculated as $f^{-1}(V_{oc})$. The function or the inverse function may be implemented as a table lookup or an equivalent equation. The exact shape of the curve 824 may vary based on the exact formulation of the Lithium-Ion battery. The voltage $V_{oc}$ changes as a result of charging and discharging of the battery. The term df(soc)/dsoc represents the slope of the curve 824, e.g., between points 820 and 822.

Figure 9:
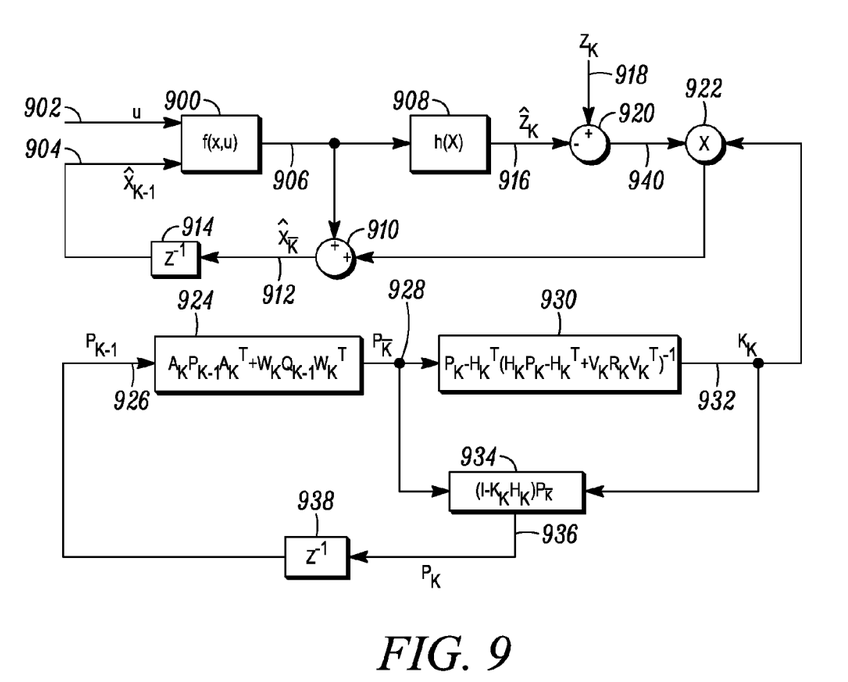
FIG. 9 is a diagram illustrating an Extended Kalman Filter.

The above equations are depicted in FIG. 9. An input u 902 and a previous state estimate $\hat{x}_{k-1}$ 904 may be fed through the system dynamic model, f(x,u) 900. The function f(x,u) 900 may be represented, for example, by equations described herein. The output may be a preliminary state estimate $\hat{x}_k^-$ 906 for the current time period. The preliminary state estimate 906 may be fed through the output model, h(x) 908 to achieve an estimate of the output variable 916. The output variable 916 in the above example is an estimate of the battery cell terminal voltage. The model h(x) 908 may be represented, for example, by equation equations described herein. The model output 916 may be subtracted 920 from a measured value 918 to generate a measurement error 940. The measured value 918 in this example may be the measured battery cell terminal voltage. The measurement error 940 may then be multiplied 922 by a gain factor $K_k$ 932.

An a priori error covariance matrix $P_k^-$ 928 may be calculated according to equations herein 924. The a priori error covariance matrix 928 may then be used to calculate the EKF gain factor 932 according to equations herein 930. An a posteriori error covariance matrix $P_k$ 936 may then be calculated as described herein 934.

Once the EKF gain factor 932 is calculated, the final state estimate 912 may be calculated by summing 910 the preliminary state estimate 906 and the product 922 of the measurement error 940 and the EKF gain 932. In preparation for the next execution cycle, the value of the state estimate 912 may be stored in controller memory. During the next execution cycle, the state estimate 912 may be available as the previous state estimate 904 which may be represented by a delay element 914. Similarly, the a posteriori error covariance matrix 936 may be saved for use during the next execution cycle which is represented by a delay element 938.

The present disclosure uses a controller to determine temperature dependent battery parameter changes after the vehicle is in the field. It can further be used to determine battery parameters when the battery is outside its regulated temperature, e.g., less than or equal to 25 degrees C., less than 20.0 degrees C., or at or less than zero degrees C.

In order to effectively learn the battery parameter values, input conditions to the estimation model may need to be valid. When valid input conditions are satisfied, the battery parameter values may be learned with sufficient accuracy. In the absence of valid input conditions, battery parameter learning may result in inaccurate values.

One condition that may be met is a persistent excitation condition. In order to effectively estimate the parameters shown above, an associated "persistent excitation" matrix (PEM) may be defined as follows, for example, if sensor measurement bias and asynchronization term is ignored:

$$PEM = \frac{1}{T_{pe}} * \int_{t_0}^{t_0+T_{pe}} \left[\frac{d(V_t(\tau)-V_{oc}(\tau))}{d\tau} i(\tau)\frac{di(\tau)}{d\tau}\right]^T * \qquad (45)$$
$$\left[\frac{d(V_t(\tau)-V_{oc}(\tau))}{d\tau} i(\tau)\frac{di(\tau)}{d\tau} 1\right] d\tau$$

where $T_{pe}$ is the time interval over which the integration takes place. Alternatively, instantaneous values may be utilized (e.g., eliminate the integration in the above equation). The integration may help filter out noisy signals and prevent rapid changes of the signals. The discrete form of equation (9) may also be used to formulate the PEM. For example, $T_{pe}$ may be set to 5 seconds so that the PEM elements are integrated over a 5 second interval. For the parameter estimates to be accurate, the PEM may need to meet certain positive semi-definiteness properties. A matrix, P, is positive semi-definite if $x^T P x \geq 0$ for all x. The persistent excitation condition is that matrices calculated as (PEM−$\alpha_1 I$) and ($\alpha_0 I$−PEM), where I is an identity matrix, are positive semi-definite. The persistent excitation condition may be expressed as $\alpha_0 I \geq PEM \geq \alpha_1 I$, but care must be taken as the expression is a matrix expression and not a scalar expression. If a matrix is positive semi-definite, all eigenvalues of the matrix are non-negative. A matrix, P, that is positive definite ($x^T P x > 0$ for all x) is invertible. The expression $\alpha_0 I \geq PEM \geq \alpha_1 I$ may be referred to as a persistent excitation condition. Note that the above PEM is of a form associated with the chosen estimation model. Different model formulations may result in a different PEM and may have a different persistent excitation condition.

In other words, if the regressor-based persistent excitation matrix satisfies certain positive definiteness conditions, then the parameter estimates may be unbiased. When the persistent excitation condition is met, the parameters may be accurately learned as the input signals may be considered to be sufficiently rich. The values $\alpha_0$ and $\alpha_1$ may define an upper and lower bound for the positive semi-definiteness of the persistent excitation matrix. The values $\alpha_0$ and $\alpha_1$ may depend on characteristics of the battery system. When the positive-definiteness criteria for the regressor-based matrix are satisfied, the input conditions may be considered to be valid. The values of $T_{pe}$, $\alpha_0$ and $\alpha_1$ may be adjusted to modify the persistent excitation condition to meet signal richness requirements for different purposes.

The persistent excitation condition may indicate that input conditions are valid for parameter estimation but does not necessarily indicate that the parameter estimation has converged to the true values. Additional monitoring of estimation errors may be performed to ascertain when the parameter estimates are converging to the actual values. An estimation convergence condition may be monitored to ascertain the convergence of the parameter estimates. One way to ascertain the quality of the parameter estimates may be to monitor the estimation error of one or more modeled variables or parameters. An error between an estimated value and a measured value may be monitored. When the magnitude of the error is bounded by a certain value over a predetermined time period, the parameter estimates may be considered to be acceptable. For example, the projection error ($V_t(t) - \hat{V}_t(t)$) from equation (6) may be monitored for convergence. The estimation convergence condition may be that the magnitude of the estimation error be less than a predetermined threshold for a predetermined time period. One or more parameter errors may be monitored and the selection of the monitored values may depend on the model and measurements that are available.

When the battery is sufficiently excited (e.g., persistent excitation condition satisfied) and the estimation error in the parameter observer remains bounded for a given period of time (e.g., estimation convergence conditions satisfied), the SOC error may also be bounded by a predetermined value. The SOC error bound may be designed to be sufficiently small and the SOC value learned by the SOC observer may be used to initialize the ampere-hour integration based SOC method. Calibration of SOC error bound may be application specific. For example, for vehicle drive control, a 2% accuracy may be sufficient. However, for battery capacity estimation, a more accurate bound may be desired. A different error magnitude threshold may be used for the estimation error depending on the desired accuracy. A lower threshold may improve accuracy of the estimation.

The above persistent excitation condition may be implemented in a controller. The controller executes instructions to calculate each element of the matrix and to calculate battery parameters.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as circuitry, Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a traction battery including a plurality of cells; and
   at least one controller programmed to implement a state estimator configured to output battery state based on a persistent excitation parameter of the traction battery and a measurement bias of the traction battery that depends on a temporal difference and a temperature difference between parameter measurements of the traction battery, and operate the traction battery according to output of the state estimator.

2. The vehicle of claim 1 wherein the state estimator applies recursive estimation and a forgetting factor to produce the output.

3. The vehicle of claim 2 wherein the forgetting factor is based on a level of persistent excitation of the traction battery.

4. The vehicle of claim 3 wherein the traction battery is subject to persistent excitation.

5. The vehicle of claim 3 wherein the forgetting factor is based on at least one of battery temperature, rate of change of battery temperature or both.

6. The vehicle of claim 5 wherein the forgetting factor uses a distributed extended Kalman filter.

7. The vehicle of claim 1 wherein the state estimator uses an Arrhenius model to determine battery state.

8. The vehicle of claim 1 wherein the traction battery includes a plurality of cells, and wherein the controller outputs, for each cell, a cell output as part of the battery state.

9. A method of controlling a vehicle comprising:
   storing charge in a plurality of cells in a traction battery;
   outputting from at least one controller a battery state estimation using a persistent excitation parameter of the traction battery and a measurement bias of the traction battery that depends on a temporal difference and a temperature difference between parameter measurements of the traction battery; and
   operating the traction battery according to a state of charge defined by output of the state estimator.

10. The method of claim 9 wherein operating includes controlling the traction battery according to battery power limits defined by output of the state estimator.

11. The method of claim 9 wherein outputting includes applying recursive estimation and a forgetting factor to produce the output.

12. The method of claim 11 wherein the forgetting factor is based on a level of persistent excitation of the traction battery.

13. The method of claim 12 wherein the traction battery is subject to persistent excitation.

14. The method of claim 11 wherein the forgetting factor is based on at least one of battery temperature, rate of change of battery temperature or both.

15. The method of claim 14 wherein the forgetting factor uses a distributed extended Kalman filter.

16. The method of claim 11 wherein outputting includes decreasing a weighting factor used by the state estimator such that newer data are given more weight in the state estimator.

17. The method of claim 9 wherein outputting includes using an Arrhenius model to determine battery state.

18. The method of claim 9 wherein operating the traction battery includes operating the plurality of cells using and outputting for each cell.

19. The method of claim 9 wherein outputting includes setting the forgetting factors based on data in look-up tables.

20. The method of claim 9 wherein outputting includes using, in the state estimator, forgetting factors that are calculated based on finite discrete levels of persist excitation, battery temperature, and battery temperature change rate, wherein the forgetting factor is smaller with a lower battery temperature or a faster temperature change than a higher battery temperature and a steady temperature, and wherein the forgetting factor is a function of the persistent excitation if the persist excitation is above a threshold and is a uniform value otherwise.

* * * * *